United States Patent
Reynolds

(10) Patent No.: US 6,956,232 B2
(45) Date of Patent: Oct. 18, 2005

(54) ELECTROABSORPTION MODULATOR

(75) Inventor: Joseph P. Reynolds, Gaithersburg, MD (US)

(73) Assignee: TriQuint Technology Holding Co., Hillsboro, OR (US)

(*) Notice: Subject to any disclaimer, the term of this patent is extended or adjusted under 35 U.S.C. 154(b) by 91 days.

(21) Appl. No.: 10/740,080

(22) Filed: Dec. 18, 2003

(65) Prior Publication Data

US 2004/0149981 A1 Aug. 5, 2004

Related U.S. Application Data

(60) Provisional application No. 60/436,417, filed on Dec. 24, 2002.

(51) Int. Cl.[7] .............................................. H01L 29/06
(52) U.S. Cl. .......................... 257/14; 359/248; 359/240; 385/14
(58) Field of Search ................................. 359/240, 248; 385/14

(56) References Cited

U.S. PATENT DOCUMENTS 5,509,025 A     4/1996  Capasso et al. ................ 372/45
5,724,174 A  *  3/1998  Meyer et al. ................. 359/248

OTHER PUBLICATIONS

Shin et al, "High–Power Electroabsorption Modulator Using Intra–Step–Barrier Quantum Wells," Journal of Applied Physics, vol. 89, pp 1515–1517 (Jan. 15, 2001).

* cited by examiner

Primary Examiner—David Nelms
Assistant Examiner—Mai-Huong Tran
(74) Attorney, Agent, or Firm—Lester Birnbaum

(57) ABSTRACT

A semiconductor modulator is disclosed which exhibits a negative alpha parameter at low operating bias. The device includes at least two barrier layers with a quantum well layer therebetween. An additional layer is formed adjacent to the quantum well layer, the additional layer having a bulk bandgap energy greater than the quantum well layer so as to form a stepped well between the barrier layers.

14 Claims, 4 Drawing Sheets

ELECTROABSORPTION MODULATOR

CROSS REFERENCE TO RELATED APPLICATION

This application claims the benefit of co-pending provisional patent application No. 60/436,417 filed Dec. 24, 2002 which is incorporated herein.

FIELD OF THE INVENTION

The present invention relates generally semiconductor optoelectronic devices and, more particularly, to an electroabsorption modulator.

BACKGROUND OF THE INVENTION

Optical systems are now a key part of telecommunications due to their ability to handle enormous amounts of information. Typical systems include a light source, such as a laser, an optical fiber to receive the light from the source and transmit it to some location, and a photodetector to convert the incoming light into an electrical signal. Typically, information is impressed on the light by means of a modulator which converts the light to a series of optical pulses. One example of such a modulator is an electroabsorption modulator (EAM) which applies an electrical bias to one or more semiconductor layers including quantum wells to change the absorption of the wells and thereby produce a series of amplitude modulated pulses corresponding to the information from the electrical signal. One of the advantages of such a device is that it can be integrated with the laser source.

Optimal performance of an EAM preferably includes good chirp performance, adequate extinction ratio, low operating bias and drive voltages, low insertion loss, high optical power handling capability, and a fast switching time. Optimizing for one of these parameters usually degrades the other parameters. Of particular importance for high speed transmission (2.5 Gbits/sec or greater) is the dynamic, or "transient" chirp, which is the frequency shift that accompanies changes in transmitted optical power on the rising and falling edges of an optical pulse.

A common metric to describe the chirp performance is the small signal alpha parameter, $\alpha$, which expresses the relationship between the phase shift of the optical signal and the derivative of the transmitted power. For light transmitted through an EAM, this can be recast in terms of the ratio of the differential change in modal index of refraction to the differential change in modal absorption. In this form, the alpha parameter, $\alpha(V,\lambda)$, is given by:

$$\alpha(V, \lambda) = \frac{\frac{\delta[\Delta n(V, \lambda)]}{\delta(V)}}{\frac{\delta[\Delta a(V, \lambda)]}{\delta(V)}} \times \frac{4\pi}{\lambda} \quad (1)$$

where V is the applied reverse bias, a is the modal absorption, n is the modal index of refraction, and $\lambda$ is the wavelength of the modulated light. It is a function of both the applied voltage and the transmission signal wavelength.

For high speed transmission systems it is often highly desirable to launch amplitude modulated signals with a low or negative dynamic chirp, as this can increase the system power penalty margin or allow longer span distances to be realized.

Conventional EAMs comprise quantum wells in which the active layer is formed from rectangular quantum well structures (i.e., high energy barriers on either side of a single low energy well. However, significant performance trade-offs have to be made in the design of multi-quantum well structures, and especially for EAMs that are integrated with lasers. For example, it is known that the alpha parameter may be reduced by employing shallow quantum wells or wide quantum wells with specifically tailored strain. However, use of shallow wells tends to increase on-state (i.e. high transmission power) insertion loss and reduce the extinction ratio over the available bias range for only a small reduction in alpha. (The extinction ratio is defined as the ratio of transmitted power in the ON and OFF states of the modulator and is typically expressed in dB). Wide wells can degrade modulator performance, specifically tailored strains can be difficult to grow and, in the case of an integrated laser structure employing a common multi-quantum well growth step, can compromise laser performance.

Stepped barrier quantum wells have been proposed for EAMs. (See Shin et al, "High-Power Electroabsorption Modulator Using Intra-Step-Barrier Quantum Wells", Journal of Applied Physics, Vol. 89, pp 1515–1517 (Jan. 15, 2001).) However, the structure was employed for analog devices to provide increased differential power transmission with respect to applied bias. It considered only the effect of the device bias on modulator absorption. It did not examine modulator refractive index effects and made no attempt to study device chirp or the small-signal alpha parameter. Reduction of the alpha parameter was not a consideration.

It is desirable, therefore, to establish quantum well EAM designs that are tailored to reduce the alpha parameter over the operating bias range of an electroabsorption modulator operating at low biases without comprising other beneficial device characteristics such as insertion loss and modulator extinction ratio.

SUMMARY OF THE INVENTION

To achieve these and other objects, and in view of its purposes, the present invention in one aspect is a semiconductor optical modulator whose absorption of light varies as an operating electrical bias is applied, the modulator comprising at least four semiconductor layers. First and second of said layers comprise materials having first and second bulk bandgap energies, respectively. Third and fourth of said layers are formed between the first and second layers, and comprise materials having third and fourth bulk bandgap energies, respectively, which are both less than the first and second bandgap energies. The fourth layer has a bulk bandgap energy that is greater than that of the third layer so as to, in combination with the third layer, form a stepped quantum well between the first and second layers. The stepped well of the third and fourth layers is such as to produce an alpha parameter which is negative at a low operating bias for the device.

In accordance with another aspect, the invention is a method of modulating light comprising providing a semiconductor optical modulator with a stepped quantum well structure between barrier layers in the path of the light. An operating electrical bias is applied to the modulator to vary the light absorption of the modulator. The electrical bias is such that the modulator exhibits only a negative alpha parameter over essentially the entire range of the applied bias.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice in the semiconductor industry, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
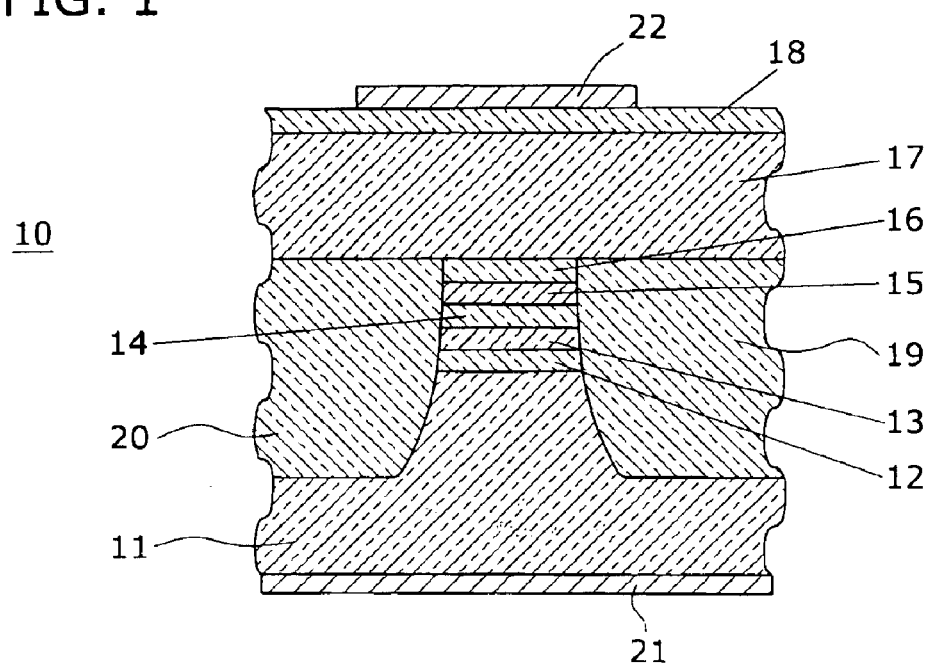
FIG. 1 is a cross sectional view of an electroabsorption modulator in accordance with an embodiment of the invention.

Referring now to the drawing, wherein like reference numerals refer to like elements throughout, FIG. 1 is a cross sectional illustration of a modulator, 10, in accordance with an embodiment of the invention. The device is formed on a semiconductor substrate, 11, which in this example is n+ type InP. A plurality of semiconductor layers, to be described, is epitaxially formed over the substrate by standard techniques such as Metal Organic Chemical Vapor Deposition (MOCVD).

Formed on the surface of the substrate, 11, is a layer, 12, which in this example is n-type InP. Formed on the layer, 12, is a layer, 13, which in this example is n-type InGaAsP, and serves as a Separate Confinement Heterostructure (SCH) for the transmitted optical signal. This layer can be omitted in other designs. Layers 11, 12, and 13 combine to form the n-side of the modulator p-i-n structure.

Figure 2:
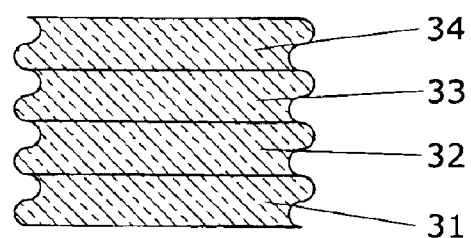
FIG. 2 is an enlarged view of a portion of the device of FIG. 1.

The active region, 14, in which light is absorbed to an extent depending on the electrical bias applied, comprises a plurality of stepped quantum well layers separated by a plurality of barrier layers, both pluralities typically composed of undoped, i.e., intrinsic semiconductor material. An enlargement of a portion of the active region comprising four layers is illustrated in FIG. 2. (This portion is typically repeated any number of times to form the plurality of stepped quantum well layers.) In each of the plurality of quantum well layers, the layer, 31, is closest to the substrate (which is below layer 31), and the layer 34 is closest to the layer 15 (which is above layer 34).

Figure 3:
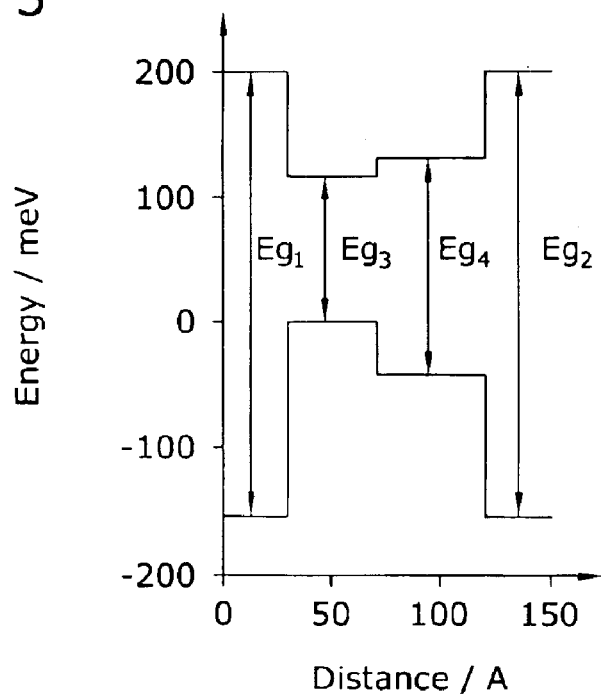
FIG. 3 is the flat-band energy diagram of the layers shown in FIG. 2.

The barrier layers of this portion of the stepped quantum well plurality are illustrated in FIG. 2 as layers 31 and 34 and typically comprise $In_{1-x}Ga_xAs_yP_{1-y}$ where values of x and y are chosen to provide relatively large bulk bandgap energy ($E_{g1}$ and $E_{g2}$ of FIG. 3). Typically these bandgaps are equal, but this need not be the case. Formed on layer 31 is a layer, 32, which provides the energy well for confinement of free carriers under low electric field conditions. Layer 32 comprises a material, in this case $In_{1-x}Ga_xAs_yP_{1-y}$ where the values of x and y are chosen so that the bulk bandgap energy ($E_{g3}$ of FIG. 3) is relatively small compared with that of the barrier layers, 31 and 34, and optimally disposed with respect to the photon energy of the signal wavelength of interest for effective modulator operation. In accordance with an aspect of the invention, an additional layer, 33, is formed adjacent to the quantum well layer, 32, and is preferably disposed towards the p-side of the modulator p-i-n structure. This layer also comprises $In_{1-x}Ga_xAs_yP_{1-y}$, but with the values of x and y chosen to produce a bulk bandgap energy ($E_{g4}$ of FIG. 3) which is between that of the quantum well layer, 32, and the barrier layers, 31 and 34. The result is a stepped quantum well structure as illustrated in FIG. 3, which will be discussed in further detail below. The layered structure of FIG. 2 can be repeated any number of times, typically between 2 and 10, to form a multi-quantum well active region, 14. The layers comprising the active region may be epitaxially matched to the substrate material, or may incorporate some degree of epitaxial strain, in a manner well understood to those familiar in the art.

The device, 10, further includes a p-type SCH layer, 15, which is also InGaAsP, and a p-type layer, 16, comprising InP. The lateral width of the layers, 12–16 in the plane of the substrate is typically defined by standard blocking regions, 19 and 20, which may comprise semi-insulating InP, or, alternatively, doped diode blocking structures well known to those skilled in the art. Formed over the layer 16 and blocking regions 19 and 20 is another layer, 17, comprising p-type InP. Layers 15, 16 and 17 combine to serve as the p-type side of the modulator structure. A highly-doped cap layer, 18, which may typically comprise p+ InGaAs is formed over the layer 17 to allow good electrical contact to the p-side layers. Electrical contact to the n and p sides of the device is provided, respectively, by metal layer, 21, formed on the bottom of the substrate and metal layer, 22, formed on the cap layer, 18.

Growth and fabrication aspects of the exemplary structure typically follow standard practices and procedures well known to those skilled in the art of semiconductor crystal growth and fabrication. Those commonly skilled in the art will also recognize that variations in the details of p-i-n and SCH layer structures may be implemented, as well as variations in the lateral structure arising from modifications in the processing sequences and procedures. Also, different layer materials may be used, both epitaxially matched and also incorporating strain, while retaining the essential details of the energy band diagram in the modulator active region and effectiveness of the optical modal confinement.

It was discovered that a device with the above-described structure can be designed to exhibit an extremely desirable small signal alpha parameter at low operating biases with a low on-state insertion loss and high extinction ratio for the transmitted light signal.

Figure 5:
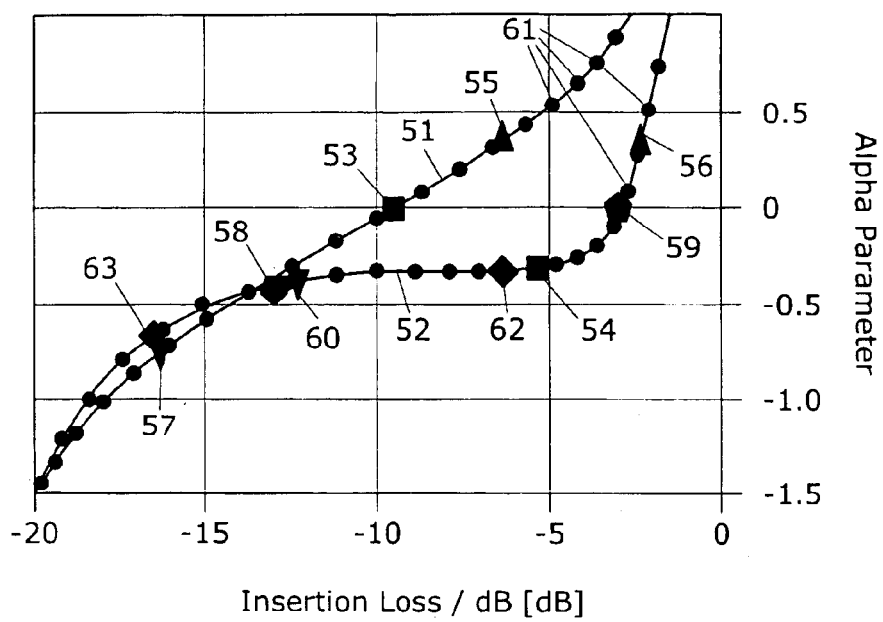
FIG. 5 is an illustration of the behavior of the alpha parameter as a function of optical transmission for a device in accordance with an embodiment of the invention and a typical prior art device.

FIG. 5 shows the calculated alpha parameter as a function of transmitted optical power for a conventional device employing a typical rectangular quantum well design, curve 51, and for a device in accordance with an embodiment of the invention, curve 52. The points, 61, on the curves indicate the computed values of the alpha parameter at bias increments of 0.1 volts. The solid lines are an interpolated fit. The designs employ strained multi-quantum wells grown in the InGaAsP-on-InP material system and are both designed for operation at a signal wavelength of 1550 nm.

The prior art device (curve 51) uses 0.4% tensile-strained barriers with a 1240 nm bandgap wavelength (bandgap energy of 1.00 eV) and 0.8% compressively-strained 70A-thick wells to form a multi-quantum well bandgap wavelength of approximately 1490 nm (0.833 eV). The exemplary embodiment of the invention (curve 52) employs identical 0.4% tensile-strained barriers and quantum well layers that comprise 0.8% compressively-strained material. However, the single 70A-thick quantum well layer of the prior art device is replaced by a 40A-thick quantum well layer (layer 32 of FIG. 2) of bandgap wavelength 1611 nm (0.770 eV), disposed on the n-side to provide the primary carrier confinement at low operating internal fields, and a 50A-thick layer (layer 33 of FIG. 2) of a shorter wavelength (1500 nm), higher energy (0.873 eV) material disposed on the p-side to form the stepped quantum layer of the invention. The quantum confining layers of the inventive device combine to provide a multi-quantum well bandgap wavelength of approximately 1510 nm (bandgap energy of 0.822 eV).

Upon examining FIG. 5, it is observed that the inventive device demonstrates superior performance over the conventional device in a number of important characteristics.

The conventional device might typically be operated with a transmissive on-state as indicated by marker 55 and an attenuated off state as indicated by marker 57 when employed in certain long haul applications systems requiring a low transmitter chirp. The on-state is chosen such that the alpha parameter becomes zero when the modulation bias achieves a −3 dB modulation extinction ratio (the point where the transmitted power is 3 dB below the on-state), as indicated by marker 53. The off-state, as indicated by marker 57, is selected to provide a signal modulation of 10 dB. These operating condition recognize the strong correlation that exists between the value of the alpha parameter at the −3 dB modulation extinction ratio and the dispersion penalty that results in such systems. It is seen from the figure that for operation under these conditions the on-state introduces a signal attenuation of approximately 6.4 dB. For applications requiring a more negative value of the alpha parameter at the −3 dB modulation extinction ratio, the required on-state 55 moves further down curve 51 and an on-state loss greater than 6.4 dB is incurred.

In comparison with the prior art device depicted by curve 51, the exemplary implementation of the inventive stepped well device depicted by curve 52 is seen to offer superior alpha parameter performance with a lower signal attenuation. If, for example, we choose to operate the device with a similar on-state alpha parameter as that chosen above for the prior art device, the on-state operating point is indicated by marker 56 on curve 52. The alpha parameter at the −3 dB modulation extinction ratio is then approximately −0.32, as indicated by marker 54, which value is negative and significantly lower than zero, zero being the comparative value for the prior art device. If we employ the off-state indicated by marker 60, so that the modulation extinction ratio is 10 dB, as for the prior-art device, we observe that the alpha parameter of the inventive device is more negative than that of the prior art device over the full operating range of the device, Importantly, we observe that the inventive device provides a significantly negative value of the alpha parameter over a range of the signal power modulation that extends above the −3 dB modulation extinction ratio and approaches the on-state condition.

The on-state signal attenuation of the inventive device, indicated by marker 56, is only approximately 2.4 dB, which is 4.0 dB lower than the comparative value of 6.4 dB for the prior art device. Indeed, as the reverse modulation bias increases from the on-state condition, the alpha parameter becomes zero at a signal attenuation level of only approximately 3.0 dB, as indicated by marker 59, compared with a signal attenuation of approximately 9.5 dB, as indicated by marker 53, for the prior art device. In accordance with these relative values, it can be seen that the inventive device provides a negative alpha parameter at both a lower signal modulation depth and for a lower signal loss than for the prior art device. The inventive device may be operated at a bit rate of at least 3.5 Gbits/sec making it compatible with high speed transmission systems.

Another method of operating the inventive device is suggested by FIG. 5. In this approach, the device is employed with an on-state as indicated by marker 62, so as to provide a degree of signal attenuation equal to that of the prior art device operated with an on-state indicated by marker 55. To achieve 10 dB of modulation extinction ratio, the off-state is as indicated by marker 63. A negative alpha parameter is now achieved over the entire range of modulation. Indeed, the on-state and off-state may now both be moved along curve 52, in concert, towards regions of lower insertion loss values. An approximate 2.5 dB improvement in signal insertion loss is achieved before there is an appreciable increase in the on-state alpha parameter, and approximately 4.5 dB improvement before the −3 dB alpha parameter increases. The device in this embodiment can be operated with a negative alpha over the usual operating bias range of approximately −0.5 to −2.5 volts.

An important practical parameter in EAM device operation is the bias swing required for modulation. This applied bias preferably is within the range of readily available electronic drive circuits and should preferably be low in order to minimize drive circuit power requirements. It is desirable for the voltage swing between on and off states to be <2 volts. In many devices, the on-state bias is approximately −0.5 volts, and the off-state bias is approximately −2.5 volts. It is seen from FIG. 5 that the modulation voltage requirements for the prior art device and the inventive device are comparable and within the range of desirable values. Operation of the prior art device from on-state 55 to off-state 57 involves a modulation voltage of approximately 0.85V. Comparable operation of the inventive device, from on-state 56 to off-state 58, involves a modulation voltage of approximately 1.2V, and operation from on-state 62 to off-state 63 involves a modulation voltage of 0.85V. Off state bias is preferably minimized since dc-coupled drive circuits are frequently used to reduce costs. For the inventive device shown in FIG. 2, a −19 dB signal attenuation is achieved for a reverse bias of 2.5 V, indicating that the above described operating modes are well within desirable voltage ranges.

In order to provide a better understanding of the invention, and not by way of limitation thereof, a discussion of the theory of operation of the inventive device as compared to a prior art device is presented below.

For a conventional rectangular well quantum well modulator, the sign of the differential change in absorption at the operating wavelength, $\delta[(\Delta a(V, \lambda)]$ in Eqn. 1, is positive under typical operating conditions and the value of the differential change in index, $\delta[(\Delta n(V, \lambda)]$ in Eqn 1, takes on a positive value at low reverse biases but becomes negative at higher reverse bias values under conditions of high absorption. The result is a modulator with a positive alpha parameter at low bias that becomes negative only at higher reverse biases and under conditions of high signal attenuation.

However, a quantum well modulator with a much reduced alpha parameter that becomes negative at lower operating biases and is accompanied by a significantly lower signal attenuation may be achieved in EAM designs that favorably modify the behavior of the differential change of index, $\delta[(\Delta n(V, \lambda)]$ at the operating wavelength $\lambda_0$.

The differential change in index $\delta(\Delta n(V, \lambda_0)$ at any given bias V is linked to the differential change in absorption through the Kramers-Kronig relation $$\delta[\Delta n(V, \lambda_0)] = (4\pi/\lambda_0) \int_0^\infty \frac{\delta[\Delta a(V, \lambda)]}{(\lambda_0^2 - \lambda^2)} d\lambda \quad (2)$$

The value of $\delta[(\Delta n(V, \lambda_0)]$ at a given bias is thus governed by the behavior of $\delta[(\Delta a(V, \lambda)]$ over the wavelength spectrum, but most significantly by those values that occur close to the operating wavelength $\lambda_0$. By managing the spectrum of $\delta[(\Delta a(V, \lambda)]$ in the wavelength region of the exciton absorption peak (the area around arrow 71 in FIG. 7) and in the wavelength region between that absorption and the signal wavelength to obtain a desirable $\delta[(\Delta n(V, \lambda_0)]$, one can control, through Equation 1, the alpha parameter.

Figure 6:
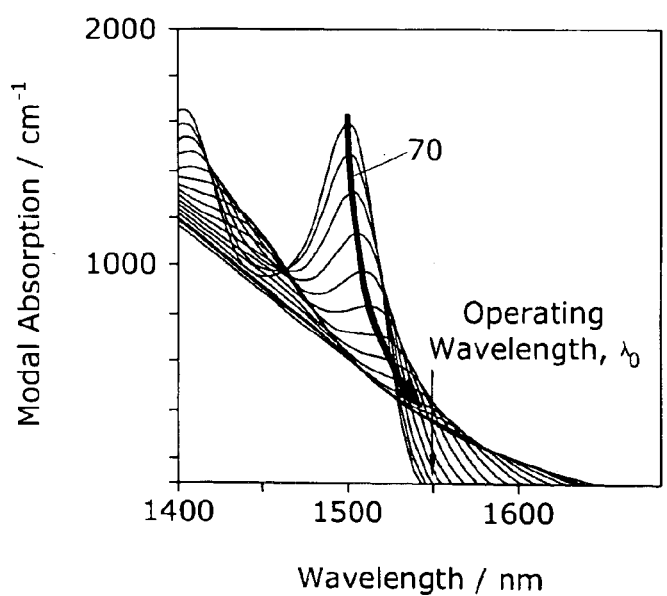
FIG. 6 is an illustration of the behavior of the absorption in a conventional prior art device employing a rectangular quantum well structure and designed for use at 1550 nm wavelength.
Figure 8:
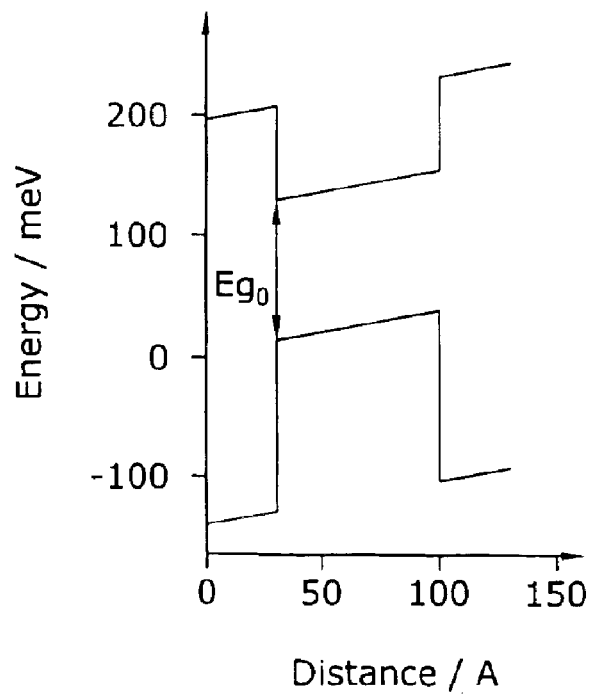
FIG. 8 represents the energy band diagram of a typical rectangular quantum well of a prior art device under an internal electric field. Such a device provides the absorption behavior illustrated in FIG. 6.

FIG. 6 illustrates the typical modal absorption behavior of a conventional quantum well EAM with rectangular wells, designed for operation at 1550 nm wavelength. The absorption is plotted for increasing values of applied reverse bias, from a low reverse bias to a high reverse bias, following the down direction of arrow 70. The energy band edge diagram of such a well is illustrated in FIG. 8, where $E_{g0}$ represents the energy between the operative bulk material conduction and valence band edges. As a reverse bias is increased, the absorption peak arising from electron-hole excitation decreases and shifts to longer wavelengths, as indicated by curved arrow 70 in FIG. 6, which follows the locus of peak values of the curves for the different applied reverse biases. This is the well-known Quantum Confined Start Effect (QCSE) red shift. The absorption at the indicated operating wavelength, 1550 nm, increases and provides the attenuating action of the EAM.

If the spectral form of $\delta[(\Delta a(V, \lambda)]$ corresponding to the absorption in FIG. 6 is plotted at low biases (that is, for a relatively low field strength across the quantum wells) it is found that $\delta[(\Delta a(V, \lambda)]$ takes on negative values in the region of the exciton absorption peak and positive values in the region between that absorption wavelength and the signal wavelength $\lambda_0$. Integration of $\delta[(\Delta a(V, \lambda_0)]$ in Equation 2 emphasizes the positive latter values and provides a positive value for $\delta[(\Delta n(V, \lambda)]$ which, in combination with the positive $\delta[(\Delta a(V, \lambda_0)]$, generates a positive alpha parameter. (The region beyond $\lambda_0$, in which $\lambda > \lambda_0$, provides a negative contribution.) At higher biases the influence of the positive differential absorption region declines in comparison to the negative region associated with the absorption peak and a negative alpha parameter results, but under conditions of high absorption loss at the operating wavelength $\lambda_0$.

Figure 4:
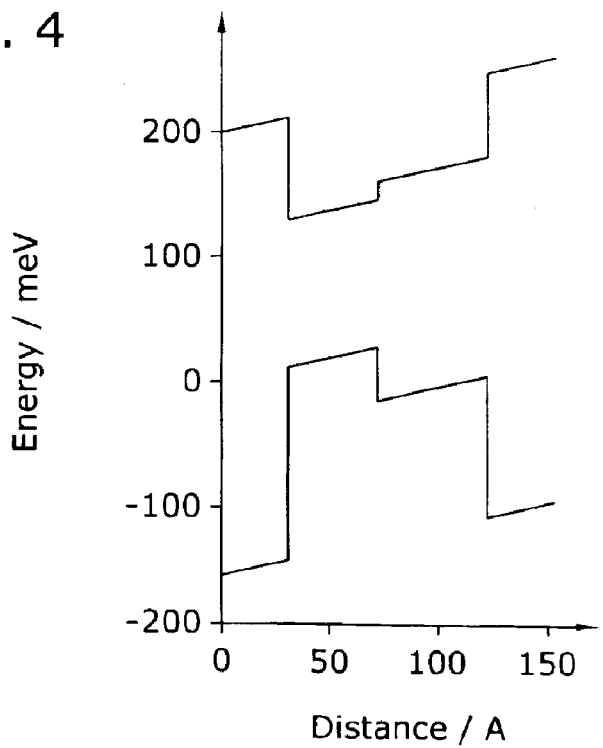
FIG. 4 is the energy band diagram of the layers shown in FIG. 2 in the presence of an electric field corresponding to a small reverse bias.
Figure 7:
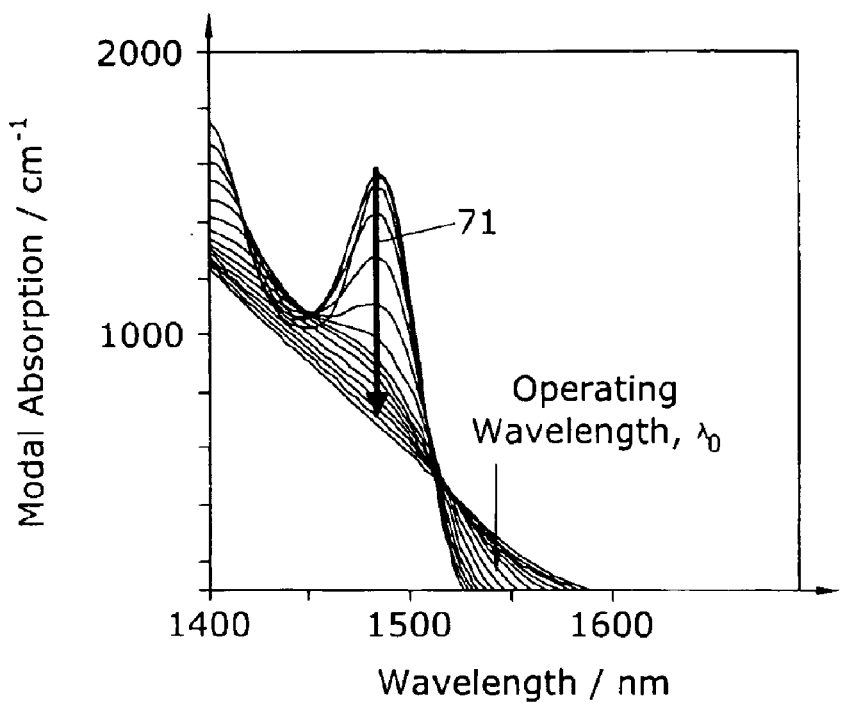
FIG. 7 is an illustration of the behavior of the absorption in a stepped well device of the invention, designed for operation at 1550 nm wavelength.

FIG. 7 illustrates the absorption behavior of a stepped quantum well EAM of the invention implemented in InGaAsP on InP, and designed for operation at 1550 nm. The energy band diagram is represented in FIG. 3 under flat-band conditions, in which $E_{g1}$, $E_{g2}$, $E_{g3}$, and $E_{g4}$ are the bulk material band-gap energies of the n-side barrier, p-side barrier, well and p-side step quantum confining layers, respectively, and in FIG. 4 for an internal field corresponding to a small reverse applied bias. Compressively-strained well material is employed and the figures indicate the operative heavy hole valence band edges. For this device, FIG. 7 shows that the electron-hole absorption peak of this stepped well device decreases with reverse bias as indicated by the arrow 71, with little red-shift (indeed, a slight blue-shift occurs at the very lowest bias values), and quenches rapidly with bias at moderate bias values. The character of the absorption change occurring between the electron-hole absorption peak and the operating wavelength is also noticeably different from the case in FIG. 6.

The form of the quenching of the absorption peak and the different character of the absorption change in the region between the peak absorption wavelength and the operating wavelength results in a $\delta[(\Delta a(V, \lambda)]$ spectrum at low-to-moderate biases that comprises relatively larger negative-going values in the region of the absorption peak and relatively smaller positive-going values in the region between the absorption peak and the operating wavelength. In the integration of Equation 2, the relatively weaker positive-going region is diminished in importance and the negative-going regions now dominate and provide a negative value of $\delta[(\Delta n(V, \lambda_0)]$, which generates the desired negative value of the alpha parameter through Equation 1.

The character of the absorption curves illustrated in FIGS. 6 and 7 result from the nature of the electron-hole excitation occurring in the respective quantum wells under the influence of an applied electric field.

In the conventional rectangular well case, the internal field generates a single confining triangular well for each carrier, as illustrated in FIG. 8. As the field increases, the confined electron and hole energy states move slightly closer together, resulting in the red-shift of the QCSE, and the wave functions separate spatially reducing the peak absorption.

In the case of the InGaAsP/InP stepped well illustrated in FIG. 7, which has a quantum well step disposed to the p-side, the electron and hole states are confined at low biases by the lowest energy bandgap material and show a suppressed QCSE red-shift due to an increase in the hole confinement energy with applied field generated by the presence of the shallow valence band step. However, as the internal field from the reverse bias increases beyond a certain range the holes become delocalized into the step layer while the electrons remain confined by the well potential barrier alone, causing a rapid decrease in the electron-hole overlap and an attendant rapid decrease in the peak absorption. At these higher fields the holes effectively come to be localized by the wider barrier comprising both well and step layers and a QCSE red-shift occurs, but at these field strengths the overlap is small and the signal attenuation is already high. It is believed that this electric field dependent behavior of the electron and hole states results in the absorption characteristic as illustrated in FIG. 7 and leads to the advantageous behavior of the alpha parameter.

The illustration of FIG. 7 is for an InGaAsP/InP tensile-strained stepped quantum well EAM with the step material layer disposed to the p-side of the quantum well. In this case, the hole delocalization into the step material layer at moderate internal fields is believed to cause the preferential alpha parameter performance. It is understood, however, that for other material systems and stepped well and barrier layer combinations, electron delocalization under moderate internal fields may also be realized, instead of or in addition to hole delocalization, and also result in an advantageous alpha parameter. For either case, the required delocalization may occur when the triangular band-edge potential reduction provided by the internal field reduces the band edge of at least a portion of the step layer material to an energy that is comparable to the confined carrier state in its thermal distribution at the operating temperature. Delocalization of the confined carrier, through both the mechanism of thermionic emission and tunneling, is aided if the relevant step barrier, being the offset energy between the relevant confined carrier state and the appropriate step layer band edge, is no more than a few times the thermal energy kT/e at the temperature of operation, where k is the Boltzmann constant, e is the charge on the electron, and T is the temperature in Kelvin, and is expressed in electron-volts. It is understood that these variations and other similar embodiments are included within the scope of the invention.

Following the above discussion, it may be understood that the design of a stepped quantum well EAM with desirable alpha parameter performance involves the careful selection of material compositions and thicknesses to provide a step well structure that manages the confinement of one or more carrier types at low internal field strengths while allowing appropriate delocalization of at least one of these carriers into a step material layer at higher internal fields, in combination with the other EAM device parameters to assure that such operation occurs under low operating bias conditions and provides a low on-state and high off-state insertion loss for the desired operating wavelength.

The specific embodiment of the invention described herein represents an optimized device design implemented in InGaAsP/InP for operation at 1550 nm. The well and step materials and layer thicknesses have been selected, in combination with the MQW structure, to provide a desirably negative alpha parameter operation at low values of insertion loss and with a high extinction ratio (preferably at least 10 dB) at an acceptable modulation voltage. This requires careful selection of various material and device parameters. Small changes in step layer thickness or in the bandgap wavelength, could significantly modify the behavior of the alpha parameter curve in relation to the signal absorption, as illustrated by FIG. 5, and compromise the operating performance. For an optimized design, a thicker step layer can increase the negative value of the alpha parameter at the lowest operating biases but tends to reduce the extinction range over which preferentially alpha values are realized, while a thinner step layer reduces the available negative alpha. Increasing step barrier height using a larger bandgap step material may enhance the negative alpha excursion but could also limit the applicable bias range and may restrict the available extinction ratio, whereas a smaller step barrier can limit the negative alpha parameter attainable. The modulator is also optimized for a given signal wavelength, and changing the peak absorption wavelength can also significantly degrade performance. Increasing the wavelength detuning (the difference between the bandgap wavelength of the quantum well structure and the signal wavelength) in an optimized device can increase the negative alpha excursion but tends to limit the applicable bias range and increase on-state loss, whereas decreasing the detuning can reduce the negative alpha values available.

In the specific example given herein, it is recommended that the third layer, 32, have a thickness in the range 30–50 angstroms, the fourth layer, 33, have a thickness in the range 50–70 angstroms, and the bandgap wavelength of the quantum well structure of the modulator be detuned by approximately 40–80 nm from the signal wavelength.

It should also be understood that the significance of the alpha parameter in determining chirp performance is diminished at the highest modulation extinction ratios because only a weak signal is transmitted. Therefore, it is possible for the alpha parameter to become positive for high reverse bias without sacrificing performance as long as the extinction ratio is greater than approximately 8 dB.

While the particular example described utilizes InGaAsP well, step and barrier material grown on InP, other ternary, quaternary and pentenary material systems, such as those incorporating InAlAs, AlGaAs, InAlGaAs, and InGaAlAsP alloy materials could be employed, either epitaxially matched or with incorporated layer strain. Appropriate adjustment of the materials, layer thicknesses and strains to achieve the desired stepped well band-edge profile in relation to the confined carrier flat-band states and the effect of device bias in providing a triangular step profile for appropriate (electron or hole) carrier delocalization at operating biases, is well within the knowledge of those skilled in the art.

Although the invention has been described with reference to exemplary embodiments, it is not limited to those embodiments. Rather, the appended claims should be construed to include other variants and embodiments of the invention which may be made by those skilled in the art without departing from the true spirit and scope of the present invention.

What is claimed:

1. A semiconductor optical modulator whose absorption of light varies as an operating electrical bias is applied, the modulator comprising:
    first and second semiconductor layers comprising materials having first and second bulk bandgap energies, respectively;
    third and fourth semiconductor layers formed between the first and second layers, and comprising materials having third and fourth bulk bandgap energies which are both less than the first and second bulk bandgap energies, the fourth layer having a bulk bandgap energy which is greater than that of the third layer so as to form in combination with the third layer a stepped quantum well between the first and second layers, the stepped quantum well of the third and fourth layers being such as to produce an alpha parameter which is negative at a low operating bias for the device.

2. The modulator according to claim 1 wherein the device exhibits a −3 dB modulation extinction ratio and the alpha parameter is negative at said value.

3. The modulator according to claim 1 wherein the alpha parameter is negative for a bias in the range −0.5 to −2.5 volts.

4. The modulator according to claim 1 wherein the alpha parameter is negative as long as the modulator exhibits an extinction ratio of at least approximately 8 dB.

5. The modulator according to claim 1 wherein the layers comprise a material selected from the group consisting of InGaAsP, InAlAs, AlGaAs, InAlGaAs, and InGaAlAsP.

6. The modulator according to claim 1 wherein the layers comprise InGaAsP.

7. The modulator according to claim 1 wherein the device exhibits an extinction ratio of at least 10 dB.

8. The modulator according to claim 1 wherein the modulator exhibits a bit rate of at least 2.5 Gbits/sec.

9. The modulator according to claim 1 wherein the modulator includes a p-i-n structure, and the fourth layer is formed on the p-side of the third layer.

10. The modulator according to claim 1 wherein the third layer is approximately 30–50 angstroms thick, the fourth layer is approximately 40–60 angstroms thick and the bandgap wavelength of the quantum well structure of the modulator is detuned by approximately 40–80 nm from a desired signal wavelength.

11. The modulator according to claim 1 wherein the third layer is approximately 40 angstroms thick with a bulk bandgap energy of approximately 0.770 eV, and the fourth layer is approximately 50 angstroms thick with a bulk bandgap energy of approximately 0.873 eV.

12. The modulator according to claim 1 wherein the stepped quantum well is such as to cause delocalization of confined carriers.

13. A method of modulating light comprising:
providing a semiconductor optical modulator with a stepped quantum well structure between barrier layers in the path of the light; and
applying an operating electrical bias to the modulator to vary the light absorption of the modulator, the electrical bias being such that the modulator exhibits only a negative alpha parameter over essentially the entire range of operating voltage.

14. The method according to claim 13 wherein the operating bias is within the range −0.5 to −2.5 volts.

* * * * *